United States Patent
Weidner et al.

(10) Patent No.: US 11,795,051 B2
(45) Date of Patent: Oct. 24, 2023

(54) THROUGH SILICON VIA AND REDISTRIBUTION LAYER

(71) Applicant: X-FAB Semiconductor Foundries GmbH, Erfurt (DE)

(72) Inventors: Thomas Weidner, Erfurt (DE); Theresa Berthold, Erfurt (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 17/032,343

(22) Filed: Sep. 25, 2020

(65) Prior Publication Data

US 2021/0087053 A1    Mar. 25, 2021

(30) Foreign Application Priority Data

Sep. 25, 2019   (GB) ...................................... 1913839

(51) Int. Cl.
| B81B 7/00 | (2006.01) |
| B81C 1/00 | (2006.01) |
| H01L 21/288 | (2006.01) |
| H01L 21/3213 | (2006.01) |
| H01L 21/768 | (2006.01) |

(Continued)

(52) U.S. Cl.
CPC ........ B81B 7/0006 (2013.01); B81C 1/00095 (2013.01); H01L 21/2885 (2013.01); H01L 21/32134 (2013.01); H01L 21/76852 (2013.01); H01L 21/76898 (2013.01); H01L 23/481 (2013.01); H01L 23/53238 (2013.01)

(58) Field of Classification Search
CPC ........... H01L 21/2885; H01L 21/32134; H01L 21/76852; H01L 21/76898; H01L 23/481; H01L 23/53238; H01L 24/02; H01L 24/03; H01L 24/05; H01L 2224/0391; H01L 2224/05082; H01L 2224/05147; H01L 2224/05186; H01L 2224/05647; B81B 7/0006; B81C 1/00095

See application file for complete search history.

(56) References Cited

U.S. PATENT DOCUMENTS

2004/0137701 A1 *  7/2004  Takao ................. H01L 23/3114
                                                     438/461
2010/0187557 A1 *  7/2010  Samoilov ............. H01L 31/101
                                                     257/E31.127

(Continued)

FOREIGN PATENT DOCUMENTS

| CN | 105428309 | 3/2016 |
| WO | WO 2014209358 | 12/2014 |

OTHER PUBLICATIONS

Search and Examination Report for Application No. GB 1913839.5, dated Mar. 5, 2020, 6 pages.

(Continued)

*Primary Examiner* — Herve-Louis Y Assouman
(74) *Attorney, Agent, or Firm* — Dority & Manning, P.A.

(57) ABSTRACT

A semiconductor device, which comprises:
a silicon substrate having a front surface and a back surface;
a metal layer located on said front surface;
a through silicon via (TSV) extending through said silicon substrate from said back surface to said front surface, wherein said TSV is connected at one end to said metal layer; and
a redistribution layer (RDL), wherein said RDL is embedded in said silicon substrate.

16 Claims, 6 Drawing Sheets

(51) Int. Cl.
  *H01L 23/48*   (2006.01)
  *H01L 23/532*  (2006.01)
  *H01L 23/00*   (2006.01)

(56) References Cited

U.S. PATENT DOCUMENTS

| | | |
|---|---|---|
| 2012/0193744 A1 | 8/2012 | Borthakur et al. |
| 2013/0207260 A1* | 8/2013 | Hsu .................. H01L 23/48 |
| | | 257/E23.021 |
| 2014/0015136 A1* | 1/2014 | Gan ............... H01L 21/76829 |
| | | 257/751 |
| 2015/0028479 A1 | 1/2015 | Ebefors et al. |
| 2015/0076677 A1 | 3/2015 | Ebefors et al. |
| 2015/0076694 A1* | 3/2015 | Kuo .................. H01L 21/486 |
| | | 257/751 |
| 2016/0233155 A1 | 8/2016 | Lee et al. |
| 2017/0372985 A1* | 12/2017 | Birner ............. H01L 29/4175 |
| 2018/0190635 A1 | 7/2018 | Choi et al. |

OTHER PUBLICATIONS

GB Office Action for corresponding GB Application No. GB1913839.5 dated Nov. 29, 2021, 5 pages.
GB Office Action for corresponding Application No. GB 1913839.5, dated Feb. 9, 2022, 6 pages.
Office Action for corresponding German Application No. 10 2020 124 728.1, dated Oct. 5, 2022, 7 pages.

* cited by examiner

THROUGH SILICON VIA AND REDISTRIBUTION LAYER

TECHNICAL FIELD

The invention relates to through silicon vias (TSVs) and redistribution layers (RDLs) in semiconductor devices such as complementary metal oxide semiconductor (CMOS) and/or Micro Electrical Mechanical Systems (MEMS) devices.

BACKGROUND

Through Silicon Vias (TSVs) can be used to provide connections to a CMOS device from the back of the wafer, which enables 3D connection structures. To make a TSV, a hole through the silicon substrate is formed and conformal deposited with copper. A copper redistribution layer (RDL) contains metal line and bond pad structures which enables connectivity (e.g. solder bumping) and functionality.

A technical problem associated with this process is the exposed copper of the TSV and RDL on the wafer surface. During etch back (wet-etch) of the wafer surface an over-etching is required to avoid copper residues between the metal lines, which could otherwise create shorts. The over-etching significantly influences the shape of the metal lines (shrinking), which can negatively affect device performance.

US2011/05840 describes an improved TSV and RDL connection structure formed using a dual damascene type process flow. Using this process, the RDL copper is embedded in an oxide layer on the back of the wafer. Chemical mechanical polishing (CMP) is then used instead to remove excess copper and provide a flat wafer surface.

SUMMARY

Aspects of the present invention provide a semiconductor device and a method of forming a semiconductor device as set out in the accompanying claims.

Preferred embodiments of the invention will now be described, by way of example only, with reference to the accompanying drawings.

DETAILED DESCRIPTION

Embodiments of the invention provide a semiconductor device such as a complementary metal oxide semiconductor (CMOS) device and/or a Micro Electrical Mechanical Systems (MEMS) device (e.g. an image sensor, a microprocessor, a microcontroller, a pressure sensor, an IR sensor etc. made in a CMOS/MEMS process) comprising a through silicon via (TSV) and a redistribution layer (RDL) that are embedded in the silicon substrate of the device. The semiconductor device may comprise a plurality of such TSVs that are formed using a damascene type process. In contrast to known technologies, the embodiments described herein bury the RDL in the bulk silicon.

By embedding the RDL (e.g. metal pads and metal lines) and TSV in the substrate (instead of in a dielectric layer on the substrate) they are protected from subsequent process steps and in particular from a subsequent wet etch. A wet etch can be used to remove superfluous copper between metal lines and pads in the RDL. In known RDL formation processes, this wet etch tends to shrink the metal lines, which can negatively affect device performance (e.g. due to increased or non-consistent resistance). By providing the RDL and the connection pad of the TSV in trenches formed directly in the silicon substrate, the metal lines suffer less shrinkage/damage by the wet etch. Embedding the RDL in the silicon substrate can also provide a more planar/smooth outer surface, which can provide better quality films and prevent blistering on the substrate.

Before turning to the figures, we first describe the semiconductor device of the figures in general terms, without referring to reference numerals. The semiconductor device described herein comprises a metal layer, which may be referred to as the first metal layer or Metal 1 (n.b. not labelled 1 in the figures). The semiconductor device may comprise a plurality of metal layers formed in the CMOS/MEMS back end of line (BEOL) process, wherein Metal 1 is the first (lowermost) metal layer (followed by Metal 2, Metal 3 etc.). The metal layer can connect to doped regions on the front surface of the silicon substrate to form transistors, diodes and other semiconductor structures of the semiconductor device. The TSV extends from a back surface of the silicon substrate, through the front surface and to the metal layer, to allow connections from the back of the silicon substrate to the metal layer. The TSV has a connection pad (also referred to as "metal pad" or "redistribution pad") on the back surface of the silicon substrate. This connection pad of the TSV is also embedded in the silicon substrate and may be considered a part of the RDL.

The TSV comprises a hole with a deposited layer of copper on the sidewalls and the bottom of the hole. Preferably, the TSV is not bulk filled with copper, which can save costs and process time due to the large aspect ratio of the TSV. Metal lines and pads of the RDL may be filled in the same step as the layer of copper is provided in the TSV, for example using electrochemical deposition (ECD). The TSV and RDL may comprise a barrier layer (e.g. titanium nitride) coating the walls of said hole and said trenches and separating said copper layer from said silicon substrate.

The semiconductor device may further comprise a protection layer covering said RDL. The protection layer may comprise one or more passivation layers (e.g. oxide and/or silicon nitride). The protection layer can provide environmental protection to the RDL and TSV as well as electrical isolation. The final copper encapsulation can be done with a Chemical Vapour Deposition (CVD) or other coating process to form the protection layer.

Embodiments of a method of forming a CMOS device are also described herein. Both the RDL and TSV are provided directly in the silicon substrate using a damascene type process. The method comprises providing the silicon substrate having a front surface and a back surface and forming the metal layer on the front surface. The method further comprises, forming the TSV extending through the silicon substrate from the back surface to the front surface, wherein the TSV is connected at one end to the metal layer, and forming the RDL, wherein the RDL is embedded in the silicon substrate.

The step of forming the TSV may comprise etching a trench in said silicon substrate for forming the connection pad of the TSV. Preferably, a reactive ion etch (RIE) is used. RIE is a type of dry etching which has different characteristics than wet etching. A RIE etch can have the advantage of providing a very anisotropic etch of the substrate. The RDL trenches for metal lines and pads can be etched using RIE in a first process step. A hole can then be etched (e.g. using RIE) through the silicon substrate to said metal layer (e.g. Metal 1). The hole typically extends through the centre of the trench formed for the connection pad of the TSV.

The method may further comprise depositing a copper layer in the trench for the connection pad and in the hole to form the TSV, wherein the copper layer does not completely fill the hole. Before the step of depositing the copper layer, a barrier layer may be deposited, which coats the walls of the hole. A copper seed layer can be provided on the barrier layer for the subsequent deposition of the copper layer.

The method may further comprise performing a wet etch to remove excess copper. The wet etch can be used to remove copper on the barrier/seed layer between metal lines and pads of the RDL to prevent shorts.

A protection layer can be provided that covers the RDL and protects the back surface of the substrate including the RDL and TSV. The protection layer can be provided by depositing one or more passivation layers. For example, a silicon nitride layer may be deposited on the back surface.

Figure 1:
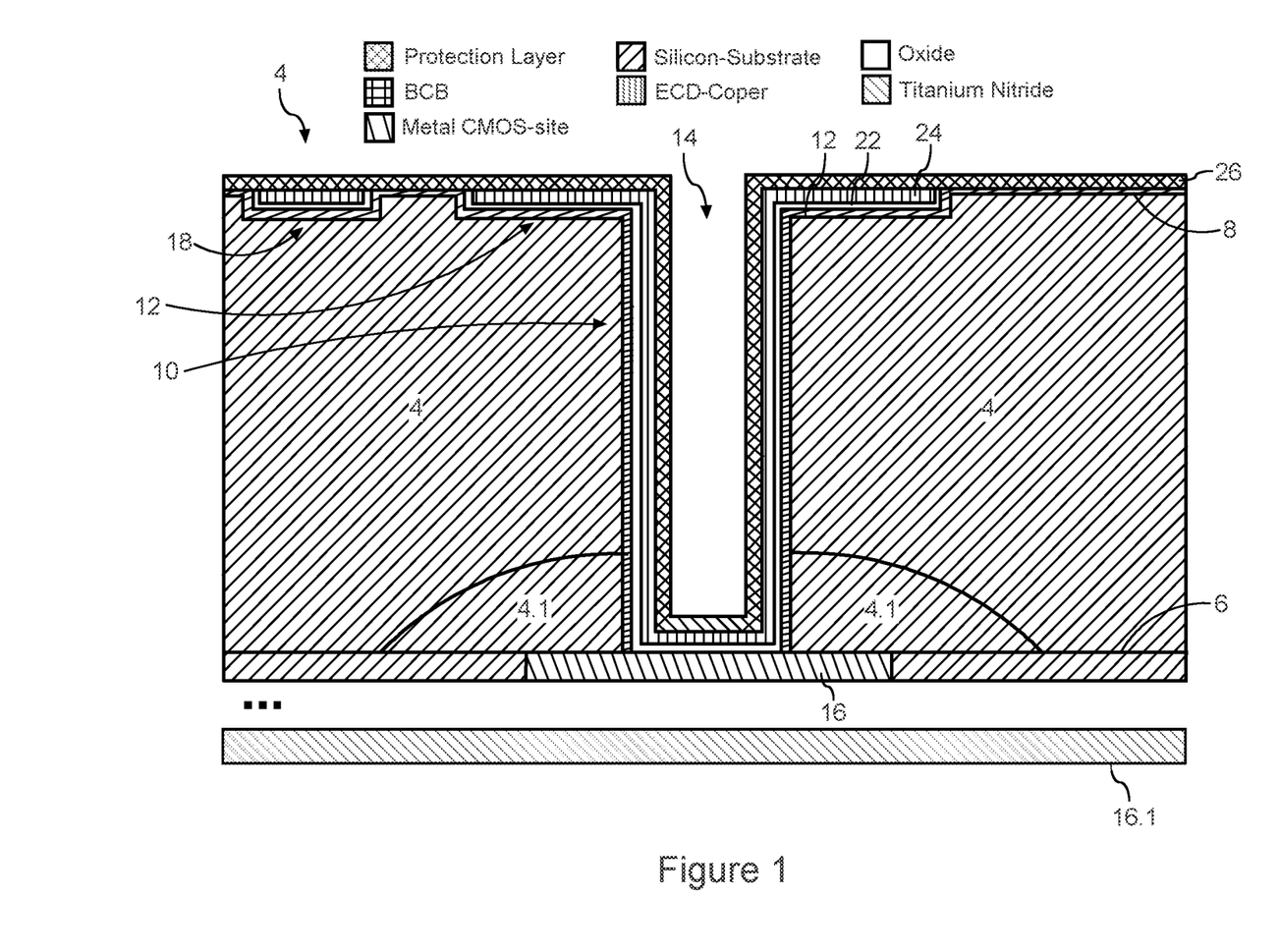
FIG. 1 shows a schematic diagram of a cross section of a CMOS device having a RDL and a TSV embedded in a silicon substrate.

FIG. 1 shows a schematic cross section of a CMOS/MEMS device 2 according to an embodiment. The device 2 comprises a silicon substrate 4 having a front surface 6 and a back surface 8. A TSV 10 extends through the substrate 4 from the back surface 8 to the front surface 6. The TSV 10 comprises a connection pad 12 at the back surface 8 and a hole 14 extending through the connection pad 12 and to the first metal layer 16 of the CMOS device 2. As described above, the first metal layer 16 (Metal 1) may be connected to doped regions 4.1 on the front surface 6 of the silicon substrate 4. As described above, the CMOS device 2 may include other metal layers, such as a second metal layer 16.1 (Metal 2). The device 2 further comprises a metal line 18 (comprising multiple layers, as described below) of a RDL. The metal line 18 is embedded in the substrate 4. Both the TSV 10 (including the connection pad 12) and the metal line 18 comprise an oxide layer 20 adjacent to the silicon substrate 4 (e.g. formed by oxidising the silicon substrate 4), a titanium nitride barrier layer 22 covering said oxide layer 20, and a copper layer 24 being an ECD copper layer. The copper layer 24 fills the metal line 18 of the RDL and the connection pad 12 of the TSV 10, but does not completely fill the hole 14 of the TSV 10. Due to the large aspect ratio of the hole 14, the copper layer 24 only coats the walls of the hole 14. A substantially flat protection layer 26 (e.g. a silicon nitride layer) covers the back surface 8, including the metal line 18 and the TSV 10.

FIGS. 2a to 2d illustrate some steps in a method of forming a CMOS/MEMS device 2, such as the device illustrated in FIG. 1. Similar or corresponding features in the figures have been given the same reference numerals for ease of understanding and are not intended to be limiting.

Figure 2A:
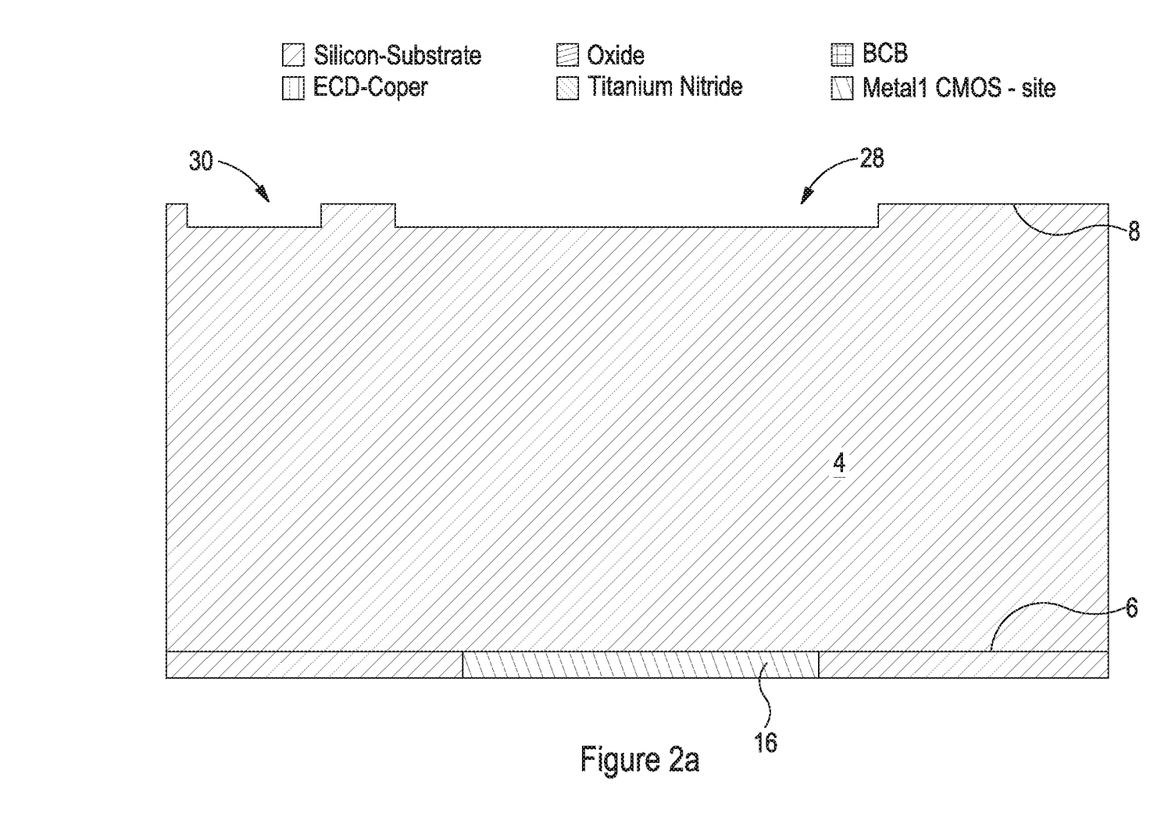
FIG. 2a shows a step of a method of forming a semiconductor device having improved functionality and connectivity, in which RIE (reactive-ion etch) trenches have been formed in the substrate for the RDL and subsequent TSV.

FIG. 2a shows a cross-section of substrate 4 having a front surface 6 with a first metal layer 16 thereon and a back surface 8. The back surface 8 of the silicon substrate has been etched using RIE to form a trench 28 suitable for the connection pad of the TSV and a trench 30 for a metal line of the RDL. Both trenches 28 and 30 are formed in the same process step using the same mask. The connection pad 12 of the TSV 10 can also be considered a part of the RDL.

Figure 2B:
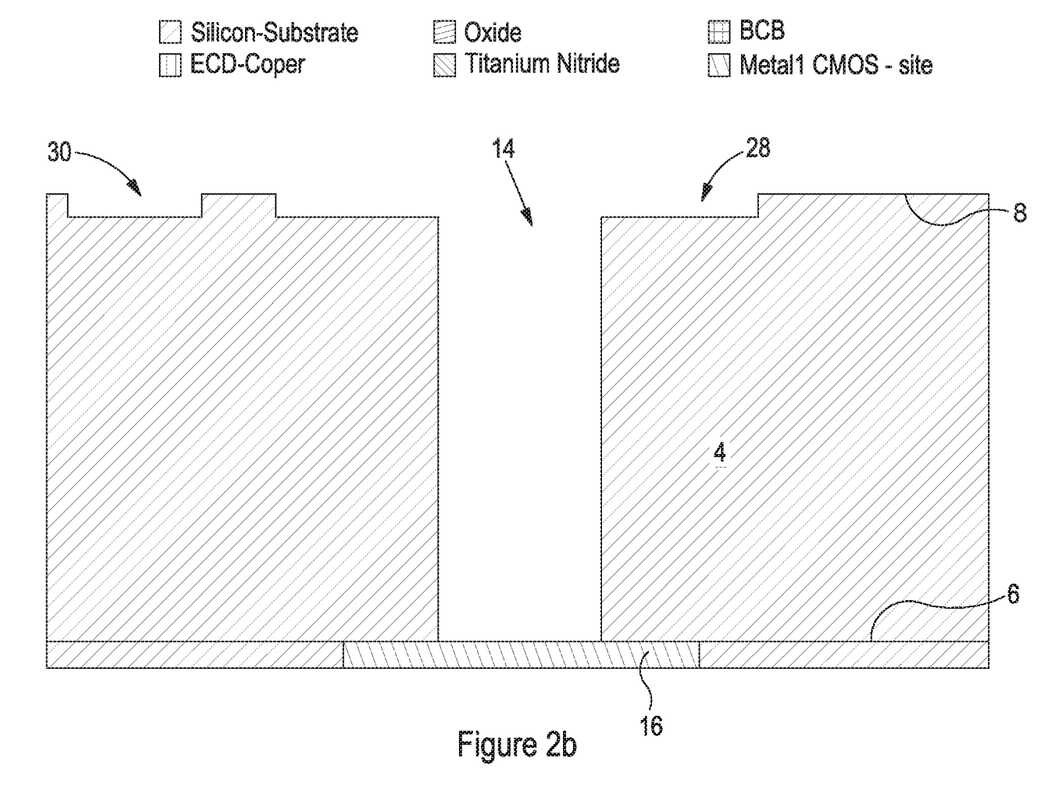
FIG. 2b shows a subsequent step of the method of forming a CMOS device, in which a hole for the TSV has been etched through the substrate.

FIG. 2b shows the hole 14 of the TSV that has been RIE etched through the substrate 4 from the back surface 8, through the front surface 6 and to the first metal layer 16. The hole 14 is etched through the centre of the trench 28 for the connection pad.

Figure 2C:
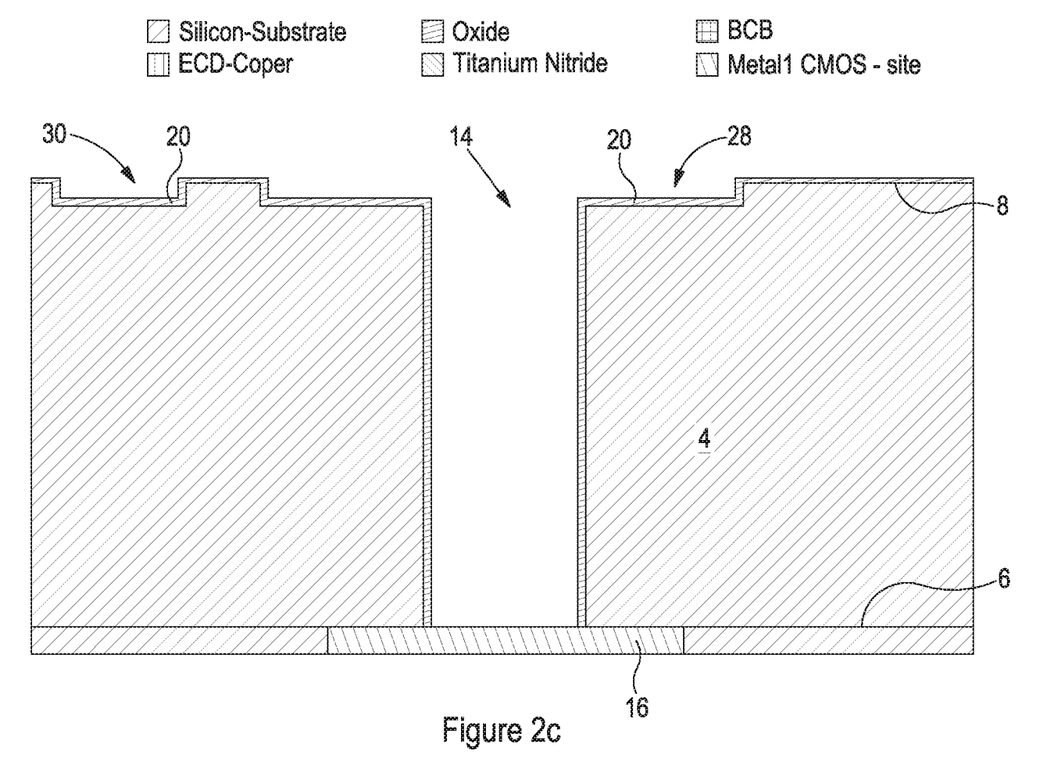
FIG. 2c shows a subsequent step of the method of forming a CMOS device, in which an oxide layer has been deposited and structured.

FIG. 2c shows the oxide layer 20 having been deposited on the silicon substrate 4. The oxide layer 20 is a passivation layer that provides some protection and electrical isolation to the underlying silicon of the substrate 4. The deposited oxide has been removed from the metal layer 16 at the end of the hole 14 in order to facilitate the electrical connection between the finished TSV and the metal layer 16.

Figure 2D:
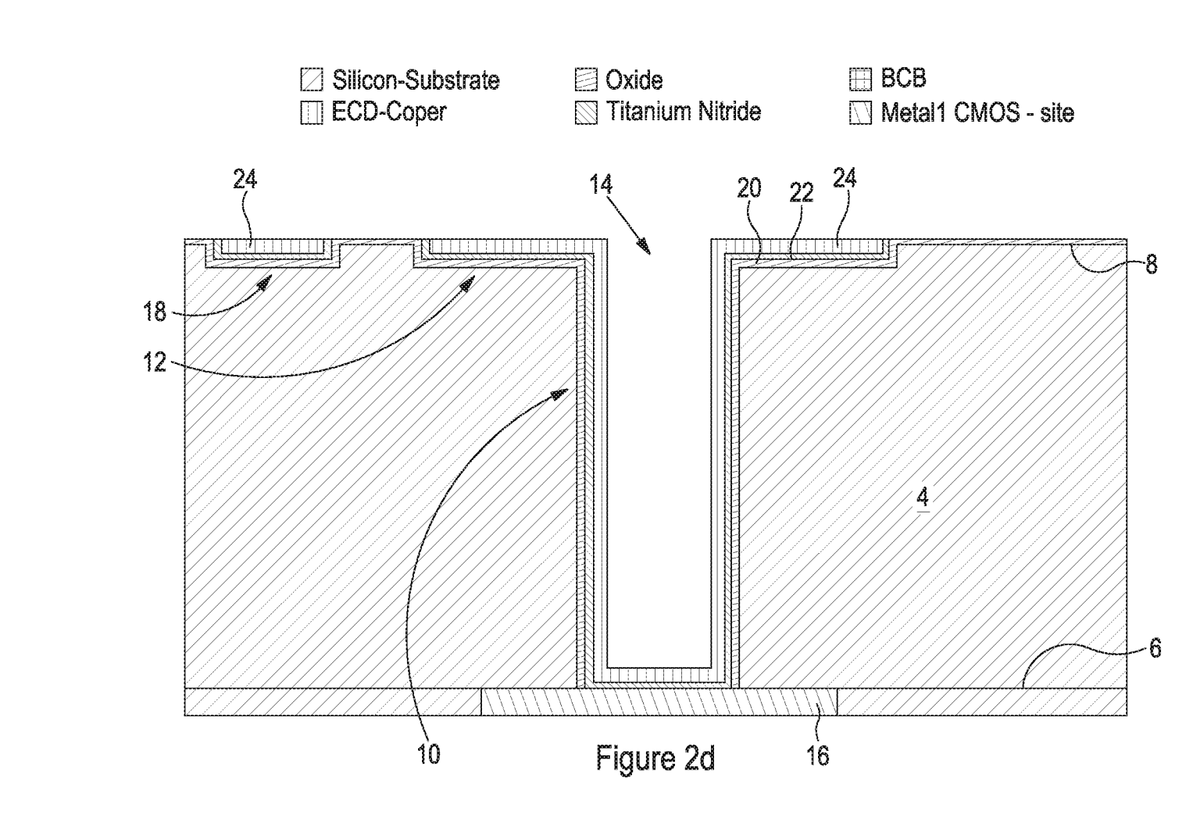
FIG. 2d shows a subsequent step of the method of forming a CMOS device, in which a barrier layer and a copper layer have been deposited.

FIG. 2d shows the titanium nitride barrier layer 22 deposited on the oxide layer 20 and ECD copper layer 24 deposited on the barrier layer to form TSV 10 and metal line 18 of the RDL. An etch back (wet etch) of the barrier layer 22 and seed layer (not shown) has been done to remove the barrier layer and seed layer in between the connection pad 12 and metal line 18, as well as in between other metal lines and pads of the RDL (not shown). In a normal damascene process it is known to use CMP after metal deposition to smooth the surface. Using a wet etch instead of CMP has the advantage of being readily available as an already/standard existing process step (e.g. in CMOS and MEMS processes), and therefore does not require the wafer to be moved to a different manufacturing process. The RIE etched trenches in the substrate 4 provide sufficient protection of the ECD copper for performing the wet etch. After the wet etch, the back surface 8 of the silicon substrate, including exposed ECD copper layer 24 and exposed oxide layer 20, are relatively flat and have a surface roughness in the range of 1 µm to 1.5 µm, which can make any potential dry film post processing more reliable.

Figure 2E:
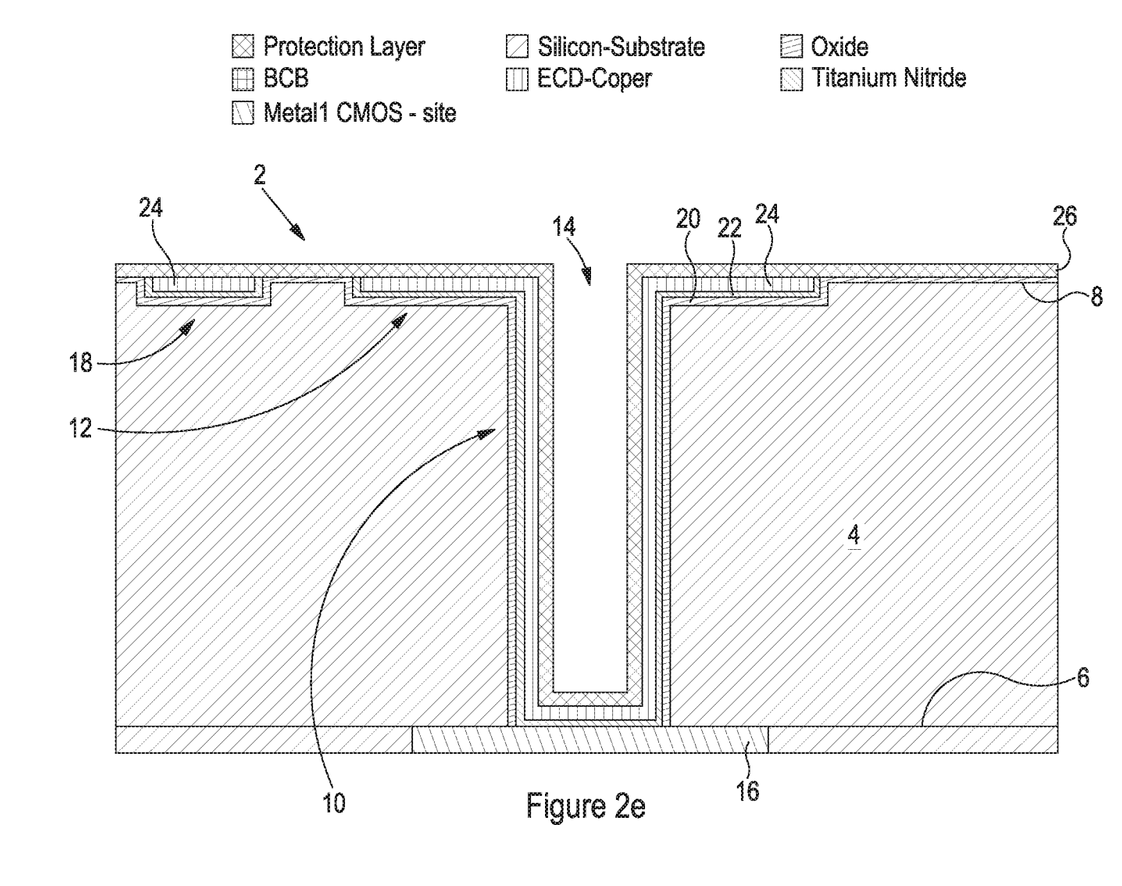
FIG. 2e shows a final step of a method of forming a CMOS device, in which a protection layer has been provided over the RDL and TSV copper.

FIG. 2e shows the finished CMOS/MEMS device 2 with RDL metal line 18 and TSV 10 after providing a protection layer 28 by depositing a passivation layer stack 26 on the back surface 8 of the substrate 4.

While specific embodiments of the invention have been described above, it will be appreciated that the invention may be practiced otherwise than as described in the specific embodiments. The descriptions above are intended to be illustrative, not limiting. It will be apparent to one skilled in the art that modifications may be made to the embodiments as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A semiconductor device comprising:
   a silicon substrate having a front surface and a back surface;
   a plurality of metal layers comprising a first metal layer located on said front surface and connected to a plurality of doped regions on the front surface of the silicon substrate to form a plurality of semiconductor structures of the semiconductor device;

a through silicon via (TSV) extending through said silicon substrate from said back surface to said front surface, wherein said TSV is directly connected at one end to said first metal layer; and a redistribution layer (RDL) connected to another end of said TSV, wherein said RDL is embedded in said silicon substrate by being located in trenches in said back surface of said silicon substrate.

2. A semiconductor device according to claim 1, wherein said TSV comprises a hole and a layer of copper, and wherein said layer of copper does not completely fill said hole.

3. A semiconductor device according to claim 1, wherein said TSV comprises a layer stack comprising at least an isolation layer and a barrier layer coating the walls of said hole and separating said copper layer from said silicon substrate.

4. A semiconductor device according to claim 1, further comprising a protection layer covering copper in said RDL and TSV.

5. A semiconductor device according to claim 4, wherein said protection layer comprises at least one passivation layer.

6. A semiconductor device according to claim 1, wherein said semiconductor device is a complementary metal oxide semiconductor (CMOS) device and/or a Micro Electrical Mechanical Systems (MEMS) device.

7. A method of forming a semiconductor device, the method comprising:

providing a silicon substrate having a front surface and a back surface;

forming a plurality of layers comprising a first metal layer on said front surface and connected to a plurality of doped regions on the front surface of the silicon substrate to form a plurality of semiconductor structures of the semiconductor device;

forming a through silicon via (TSV) extending through said silicon substrate from the back surface to the front surface, wherein said TSV is directly connected at one end to said first metal layer; and forming a redistribution layer (RDL) connected to another end of said TSV, wherein said RDL is embedded in said silicon substrate, wherein said step of forming said RDL comprises etching trenches in said back surface of said silicon substrate for forming metal lines and/or metal pads of said RDL.

8. A method according to claim 7, wherein said step of forming the TSV comprises:

etching a trench in said silicon substrate for forming a connection pad of said TSV;

etching a hole through said silicon substrate to said first metal layer;

depositing a copper layer in said trench and in said hole to form said TSV, wherein said copper layer does not completely fill said hole.

9. A method according to claim 8, wherein said step of forming said TSV further comprises, before said step of depositing said copper layer, providing a layer stack comprising at least an isolation layer and a barrier layer coating the walls of said hole.

10. A method according to claim 8, wherein said step of depositing copper comprises performing electrochemical deposition (ECD).

11. A method according to claim 7, wherein said step of forming said RDL comprises:

filling said trenches with copper.

12. A method according to claim 7, further comprising performing a wet etch to remove excess copper.

13. A method according to claim 7, further comprising providing a protection layer covering copper in said RDL and TSV.

14. A method according to claim 13, wherein said step of providing a protection layer comprises depositing at least one passivation layer.

15. A method according to claim 7, wherein said first metal layer is in a backend stack of said semiconductor device.

16. A method according to claim 7, forming a semiconductor device comprises forming a complementary metal oxide semiconductor (CMOS) device and/or a Micro Electrical Mechanical Systems (MEMS) device.

* * * * *